(12) United States Patent
Sandhu et al.

(10) Patent No.: US 7,955,935 B2
(45) Date of Patent: *Jun. 7, 2011

(54) NON-VOLATILE MEMORY CELL DEVICES AND METHODS

(75) Inventors: Gurtej S. Sandhu, Boise, ID (US); Kirk D. Prall, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1310 days.

This patent is subject to a terminal disclaimer.

(21) Appl. No.: 11/513,933

(22) Filed: Aug. 31, 2006

(65) Prior Publication Data

US 2008/0121976 A1   May 29, 2008

Related U.S. Application Data

(63) Continuation-in-part of application No. 11/498,523, filed on Aug. 3, 2006, now Pat. No. 7,560,769.

(51) Int. Cl.
   *H01L 21/336* (2006.01)
(52) U.S. Cl. .................. 438/288; 438/287; 257/E21.18
(58) Field of Classification Search .................. 438/260, 438/264, 287, 288; 257/321, 314, E21.18
   See application file for complete search history.

(56) References Cited

U.S. PATENT DOCUMENTS

| | | | |
|---|---|---|---|
| 5,714,766 A | 2/1998 | Chen et al. | |
| 6,319,774 B1 | 11/2001 | Hai | |
| 6,331,463 B1 | 12/2001 | Chen | |
| 6,744,099 B2 | 6/2004 | Tsuchiya et al. | |
| 6,762,093 B2 | 7/2004 | Rudeck | |
| 6,906,377 B2 | 6/2005 | Ni et al. | |
| 6,949,793 B2 | 9/2005 | Choi et al. | |
| 6,970,053 B2 | 11/2005 | Akram et al. | |
| 7,005,697 B2 | 2/2006 | Batra et al. | |
| 7,057,940 B2 | 6/2006 | Hsu et al. | |
| 7,501,315 B2 | 3/2009 | Heald et al. | |
| 2003/0153151 A1 | 8/2003 | Choi et al. | |
| 2003/0218214 A1 | 11/2003 | Tsuchiya et al. | |
| 2003/0235064 A1 | 12/2003 | Batra et al. | |

(Continued)

FOREIGN PATENT DOCUMENTS

EP   1411555 A2   4/2004

(Continued)

OTHER PUBLICATIONS

IC Knowledge, LLC, "Technology Backgrounder: Atomic Layer Deposition", pp. 7 (2004).

(Continued)

*Primary Examiner* — Lex Malsawma
*Assistant Examiner* — Robert Huber
(74) *Attorney, Agent, or Firm* — Brooks, Cameron & Huebsch, PLLC

(57) ABSTRACT

A method of fabricating a memory cell including forming nanodots over a first dielectric layer and forming an intergate dielectric layer over the nanodots, where the intergate dielectric layer encases the nanodots. To form sidewalls of the memory cell, a portion of the intergate dielectric layer is removed with a dry etch, where the sidewalls include a location where a nanodot has been deposited. A spacing layer is formed over the sidewalls to cover the location where a nanodot has been deposited and the remaining portion of the intergate dielectric layer and the nanodots can be removed with an etch selective to the intergate dielectric layer.

14 Claims, 14 Drawing Sheets

U.S. PATENT DOCUMENTS

| | | |
|---|---|---|
| 2004/0026682 A1 | 2/2004 | Jiang |
| 2004/0137704 A1 | 7/2004 | Kim et al. |
| 2004/0224534 A1 | 11/2004 | Beulens et al. |
| 2005/0067659 A1 | 3/2005 | Gutsche et al. |
| 2005/0095786 A1 | 5/2005 | Chang et al. |
| 2005/0202639 A1 | 9/2005 | Yoo et al. |
| 2005/0287717 A1 | 12/2005 | Heald et al. |
| 2006/0003531 A1 | 1/2006 | Chang et al. |
| 2006/0014329 A1 | 1/2006 | Park et al. |
| 2006/0081911 A1 | 4/2006 | Batra et al. |
| 2006/0086970 A1 | 4/2006 | Kim |
| 2006/0110870 A1 | 5/2006 | Bhattacharyya |
| 2006/0186462 A1 | 8/2006 | Han et al. |
| 2006/0202254 A1 | 9/2006 | Lai et al. |
| 2006/0211199 A1* | 9/2006 | Rao et al. .................. 438/257 |
| 2007/0212832 A1* | 9/2007 | Orlowski .................. 438/257 |

FOREIGN PATENT DOCUMENTS

| | | |
|---|---|---|
| EP | 1418625 A1 | 5/2004 |
| EP | 1437775 A2 | 7/2004 |
| EP | 1 737 033 A1 | 12/2006 |
| WO | WO 2006/007069 A2 | 1/2005 |
| WO | WO 2005/036599 A2 | 4/2005 |
| WO | WO 2005/101488 A1 | 10/2005 |

OTHER PUBLICATIONS

Winkler, O, et al. "Semiconductor Nanocrystals vol. 1", Silicon nanodot fabrication and application in nonvolatile memories, B. Podör, et al., eds, pp. 190-196 (Sep. 2005).

United States Patent and Trademark Office Action for related U.S. Appl. No. 11/498,523 dated Dec. 26, 2007 (24 pgs.).

Applicants Amendment and Response dated Mar. 19, 2008 to Examiner's Office Action dated Dec. 26, 2007 (19 pgs.).

United States Patent and Trademark Final Office Action for related U.S. Appl. No. 11/498,523 dated Jul. 9, 2008 (28 pgs.).

Applicant's Amendment and Response dated Jul. 24, 2008 to Examiner's Final Office Action dated Jul. 9, 2008 (20 pgs.).

United States Patent and Tradmark Office Action for related U.S. Appl. No. 11/498,523 dated Aug. 28, 2008 (26 pgs.).

Applicant's Amendment and Response dated Oct. 29, 2008 to Examiner's Office Action dated Aug. 28, 2008 (20 pgs.).

International Search Report (7 pgs.).

Partial International Search Report (9 pgs.).

* cited by examiner

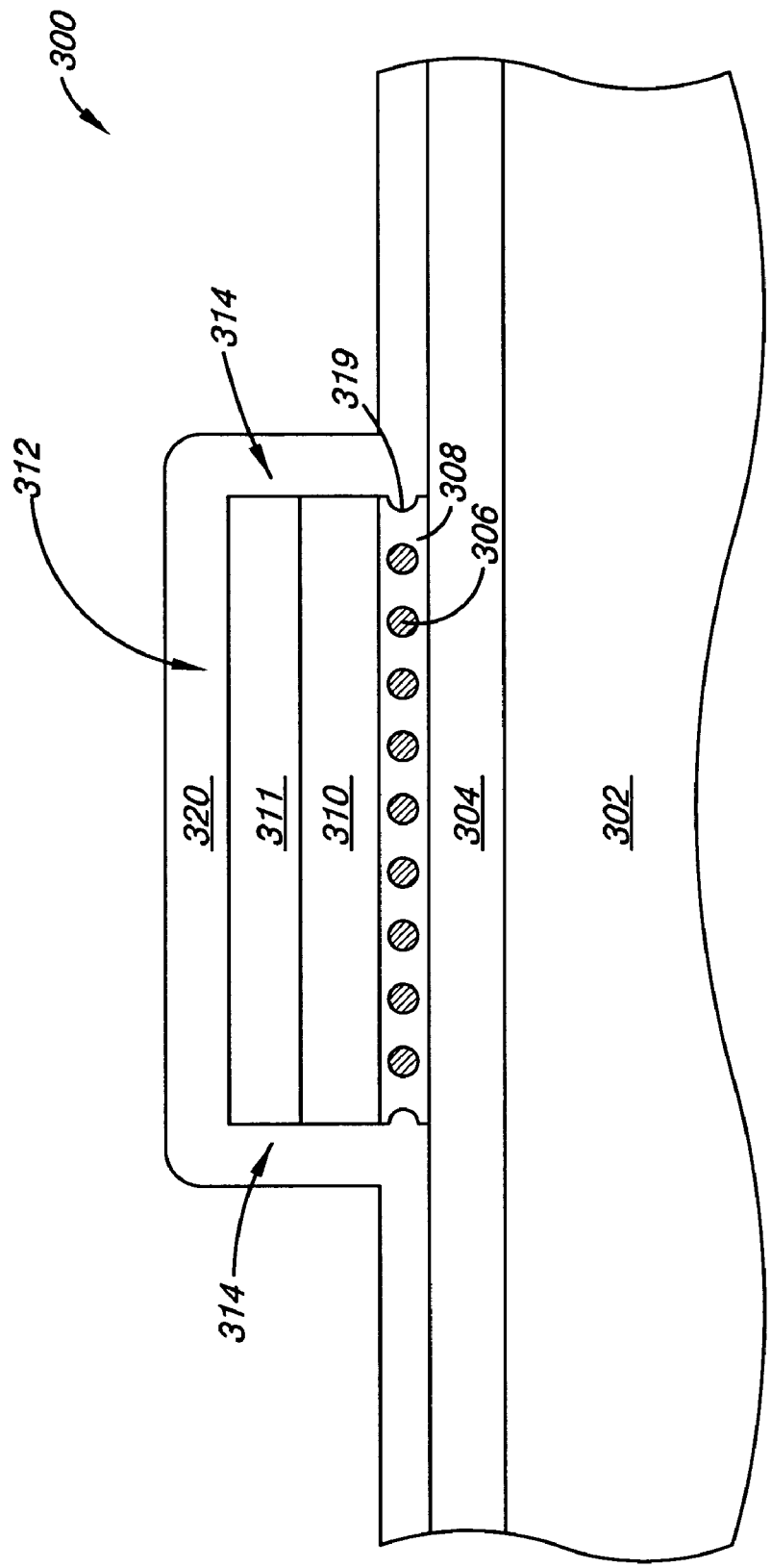

NON-VOLATILE MEMORY CELL DEVICES AND METHODS

CROSS-REFERENCE TO RELATED DOCUMENTS

The present application is a continuation in part (CIP) to a U.S. patent application Ser. No. 11/498,523, a filed on Aug. 3, 2006, now U.S. Pat. No. 7,560,769 and entitled "Non-Volatile Memory Cell Device and Methods", the disclosure of which is incorporated in its entirety herein by reference.

BACKGROUND

Nanodots may be used in a wide variety of optical devices including light emitting diodes (LEDs), laser diodes (LDs), and photodetectors. Nanodots may also be used in single electron transistors. Through the use of nanodots, it may be possible to improve the performance of a device by improving retention characteristics.

For example, when a plurality of nanodots are distributed throughout a flash memory device instead of a conventional floating gate, the voltage required for storing information may be smaller than the current required for a conventional flash memory device with a floating gate and thus, the amount of power consumed may be decreased by using the nanodot device. The improved characteristics exhibited by the nanodot device may be attributed to distributed charge being stored across multiple nanodots, limiting charge leakage from the nanodots. Accordingly, nanodot technology is considered promising for next-generation technology.

The size of semiconductor memory devices, and the thin dielectric films that are used in these devices, has been scaled down in order to accommodate the diminishing feature size of elements on a chip. One problem with the continued scaling down in floating gate memory devices is that the charge retention characteristics of the devices are very sensitive to the presence or absence of defects in the tunnel oxide. A reduction in the thickness of the tunnel oxide, to allow for further scaling down, increases the risk of defects occurring in the tunnel oxide.

BRIEF DESCRIPTION OF THE DRAWINGS

FIGS. 3A-3E illustrate cross-sectional views of a portion of a memory array during various stages of fabrication in accordance with an embodiment of the present disclosure.

DETAILED DESCRIPTION

Figure 1A:
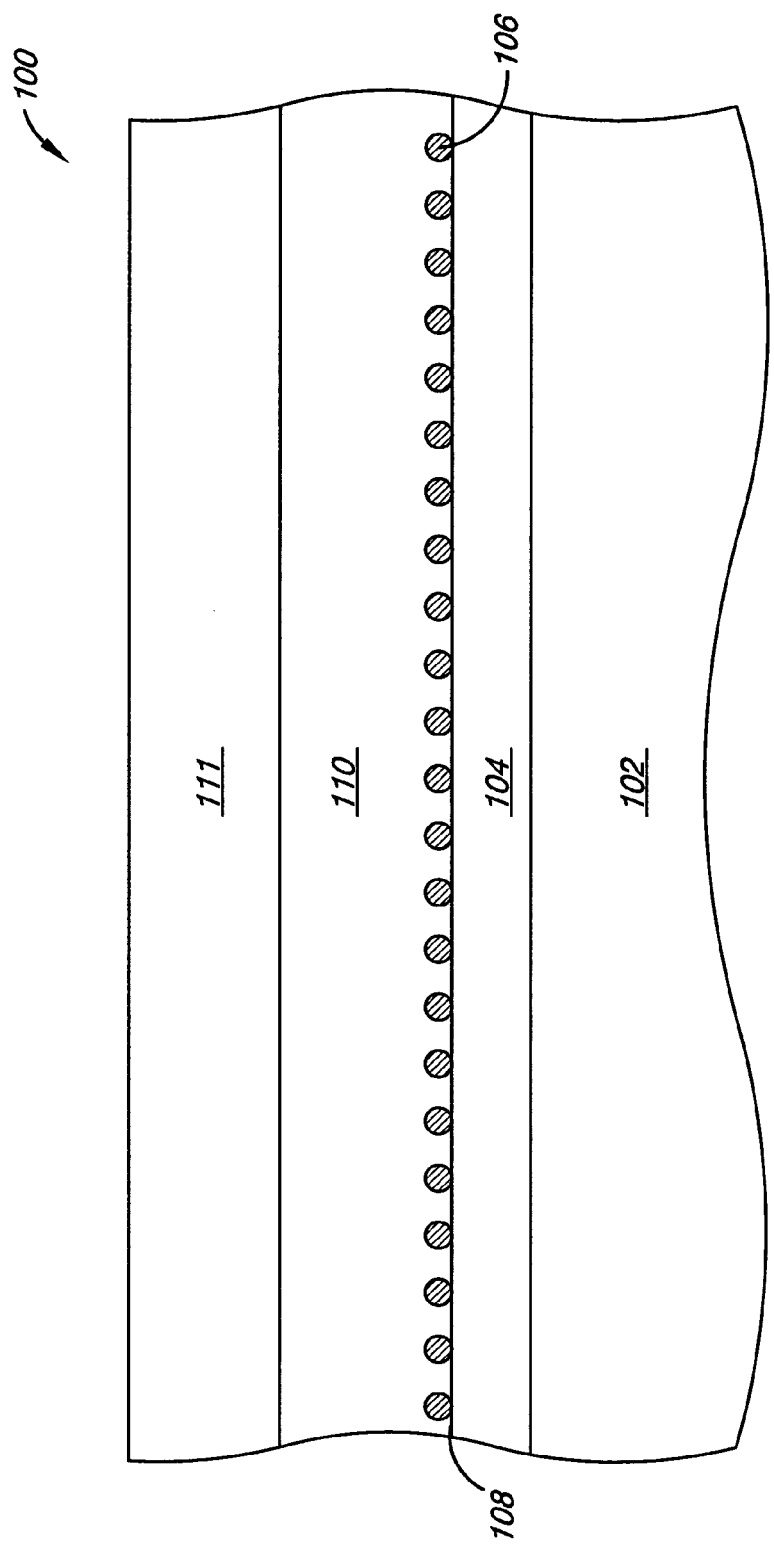
FIGS. 1A-1E illustrate cross-sectional views of a portion of a memory array during various stages of fabrication in accordance with an embodiment of the present disclosure.

To accommodate the diminishing feature size of elements on a chip, one approach has been to store the charge in a floating gate in a distributed manner comprised of a plurality of nanodots instead of a monolithic floating gate. This plurality of nanodots strongly reduces the sensitivity of the device to incidental defects in the tunnel oxide. In such a situation, when a defect is present, a nanodot immediately adjacent the defect might lose its charge or be unable to charge but the other nanodots are not affected.

Flash memory is one form of a nonvolatile memory having a floating gate and will be referred to for illustrative purposes throughout this specification. Nevertheless, embodiments of the present disclosure are not limited to flash memory cells and can be embodied in an alternate form of non-volatile memory cell having a floating gate.

The term "substrate" or "substrate assembly" used in the following description may include a number of semiconductor-based structures that have an exposed semiconductor surface. Structure can be understood to include silicon, silicon-on-insulator (SOI), silicon-on sapphire (SOS), doped, and undoped semiconductors. In addition, structure can be understood to include epitaxial layers of silicon supported by a base semiconductor foundation. The base semiconductor foundation is typically the lowest layer of silicon material on a wafer or a silicon layer deposited on another material.

The semiconductor need not be silicon-based. For example, the semiconductor can be silicon-germanium, germanium, or gallium-arsenide. When reference is made to "substrate" in the following description, previous process steps may have been utilized to form regions or junctions in or on the semiconductor structure and/or foundation. When reference is made to a substrate assembly, various process steps may have been previously used to form or define regions, junctions, various structures or features, and openings such as capacitor plates or barriers for capacitors.

As used herein, "layer" can refer to a layer formed on a substrate using a deposition process. The term "layer" is meant to include layers specific to the semiconductor industry, such as "barrier layer," "dielectric layer," and "conductive layer." The term "layer" is also meant to include layers found in technology outside of semiconductor technology, such as coatings on glass.

In the Figures, the first digit of a reference number refers to the Figure in which it is used, while the remaining two digits of the reference number refer to the same or equivalent parts of embodiment(s) of the present disclosure used throughout the several figures of the drawing. The scaling of the figures does not represent precise dimensions and/or dimensional ratios of the various elements illustrated herein.

Embodiments of the present disclosure will now be described in detail with reference to the accompanying figures. It should be noted that although the figures illustrate only one memory cell, the semiconductor structures contemplated herein can have more than one memory cell.

In some embodiments, a method of fabricating a memory cell stack can include depositing nanodots over a first dielectric layer, and forming an intergate dielectric layer over the nanodots, where the intergate dielectric layer encases the nanodots. To form sidewalls, a portion of the intergate dielectric layer is removed where the sidewalls can include a location where a nanodot has been deposited. In addition, a spacing layer can be formed over the sidewalls to cover the location where a nanodot has been deposited. A remaining portion of the intergate dielectric layer and the nanodots can be removed with an etch selective to the intergate dielectric layer.

In various embodiments, a second dielectric layer can be formed between the intergate dielectric layer and the first dielectric layer. In some embodiments, the second dielectric layer can encase the nanodots.

In some embodiments, a method of fabricating a memory cell stack can include depositing nanodots over a first dielectric layer and forming a second dielectric layer over the nanodots, where the second dielectric layer encases the nanodots. In addition, an intergate dielectric layer can be formed over the second dielectric layer and patterned to form sidewalls to the memory cell stack. To form the sidewalls, a portion of the intergate dielectric layer and a portion of the second dielectric layer can be removed with a dry etch, where the sidewalls can include a location where a nanodot has been deposited. A spacing layer can be formed over the sidewalls to cover the location where a nanodot has been deposited. The remaining exposed portions of the second dielectric layer and exposed nanodots can be removed with an isotropic etch selective to the second dielectric layer, e.g., the isotropic etch removes the nanodots more aggressively than the second dielectric layer.

In some embodiments, a memory cell includes a floating gate formed by nanodots in a dielectric layer above a source and drain region or a channel region without a presence of voids at a location where a nanodot had been deposited, but had subsequently been removed in processing or fabrication, between a control gate layer and the source and drain region or channel region. In such embodiments, an intergate dielectric layer can be between the nanodots and the control gate layer.

Figure 1B:
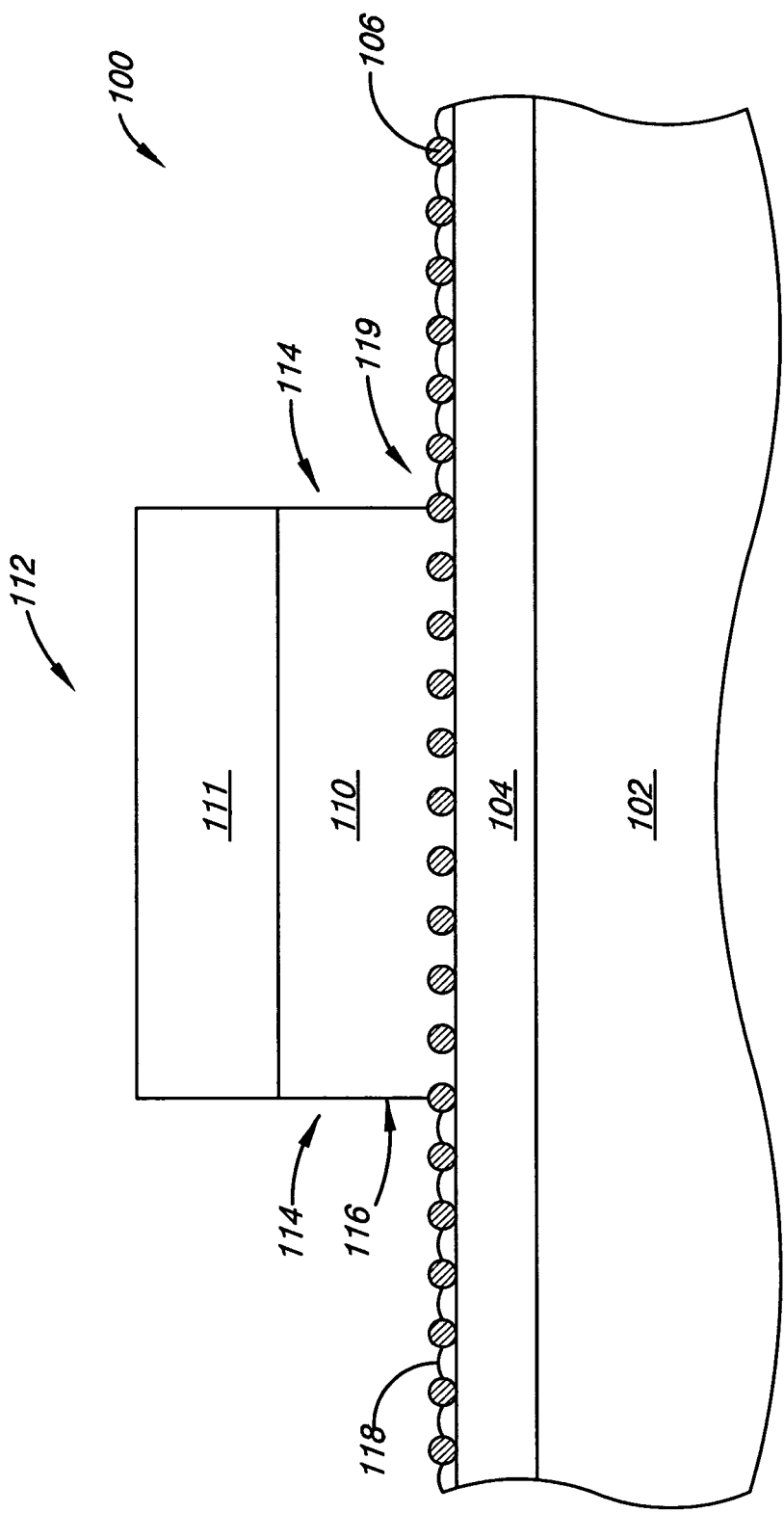
Figure 1C:
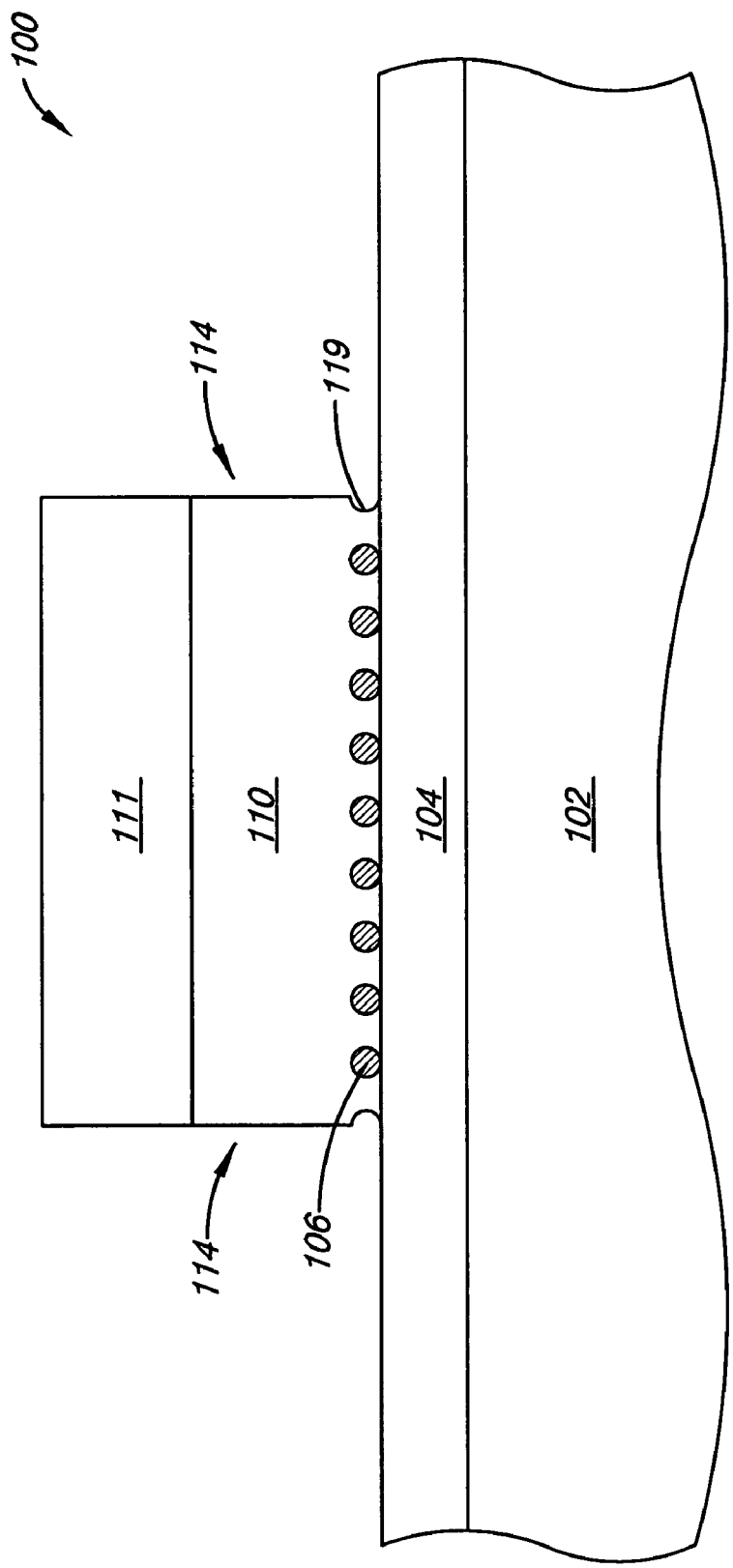
Figure 1D:
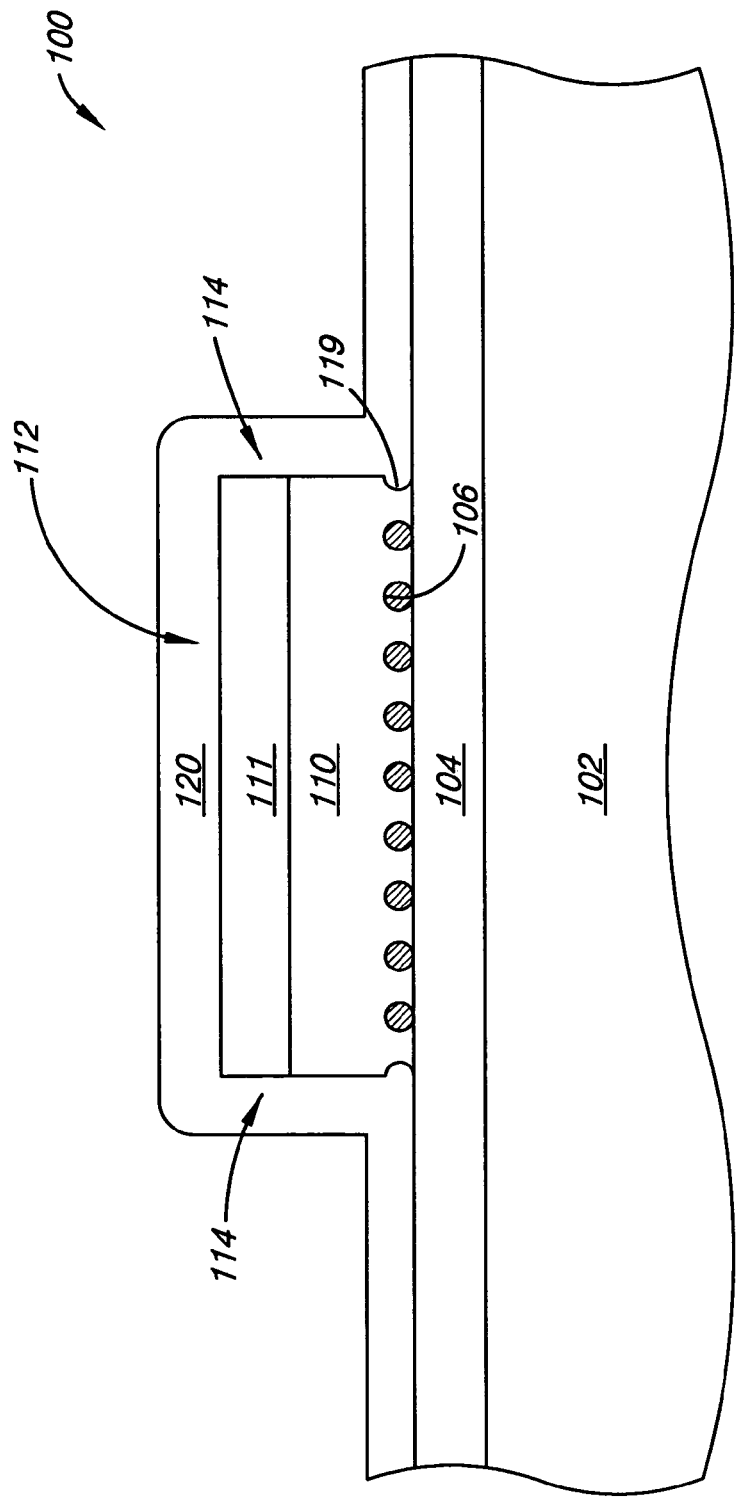
Figure 1E:
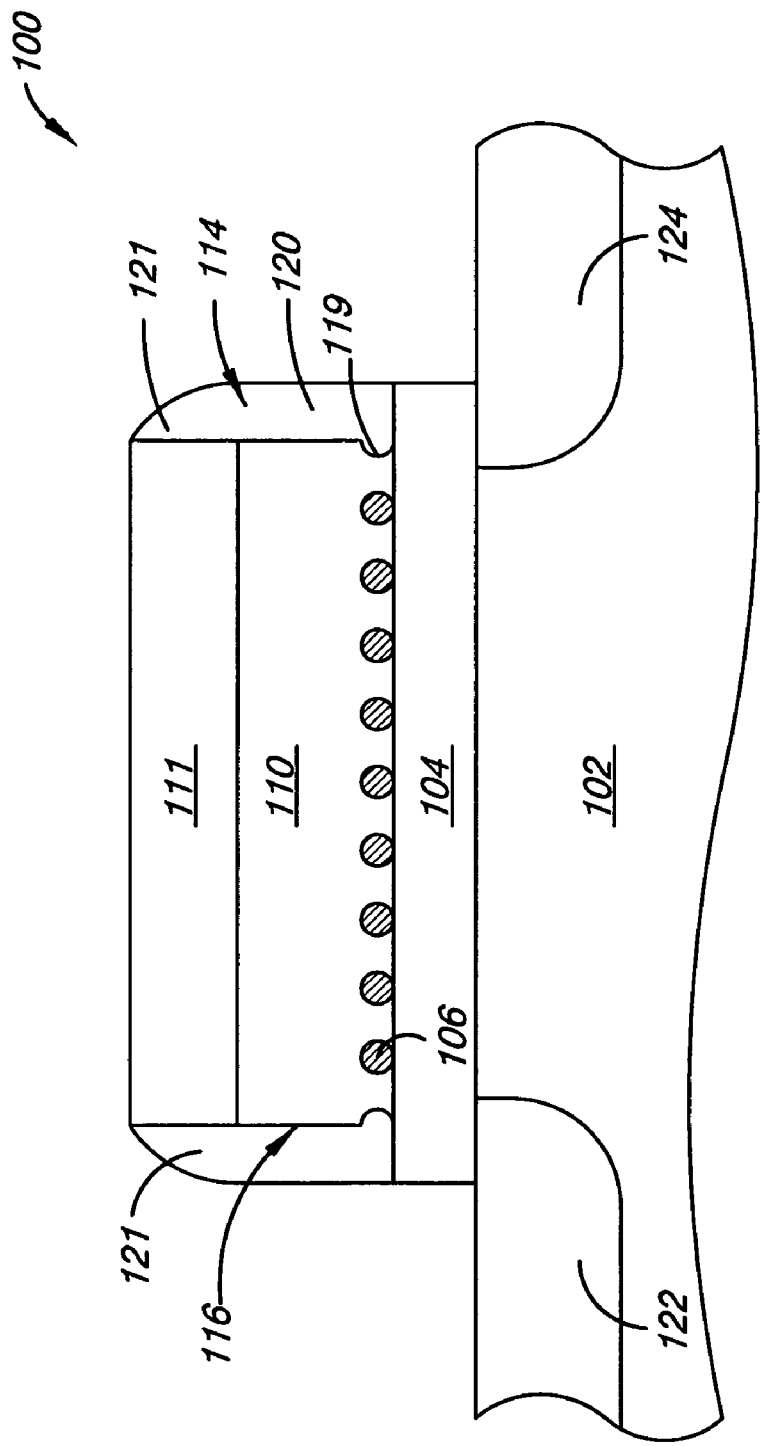

FIGS. 1A through 1E illustrate an example of an embodiment of a method of fabricating a memory cell including a nanodot layer and a spacer and the resulting device (FIG. 1E). FIG. 1A shows a cross-sectional view of a portion of a memory cell, indicated with reference numeral 100, shown without a patterned control gate structure. The device 100 includes a substrate 102. In one embodiment, the substrate 102 can be made from silicon. For example, the substrate 102 can be a p-type silicon substrate (for forming an n-channel storage device). In some embodiments, the substrate 102 can be an SOI substrate 102. In other embodiments, the substrate 102 can include gallium arsenide (GaAs) or other semiconductor materials including, but not limited to: Si, Ge, SiGe, InAs, InP, CdS, CdTe, other III/V compounds, and the like.

As shown in FIG. 1A, a first dielectric layer 104 is formed over the substrate 102. In some embodiments, the first dielectric layer 104 can be a tunnel oxide layer. In such embodiments, the first dielectric layer 104 can be formed of a material such as silicon dioxide ($SiO_2$), and can be formed with a method such as thermal oxidation. Thermal oxidation includes heating the substrate 102 in an oxygen ambient at high temperature (e.g., 800° C. to about 1100° C.) until the oxide is formed on the surface of the substrate 102. It is also possible to form the first dielectric layer 104 by deposition processes such as, but not limited to, chemical vapor deposition (CVD) and plasma vapor deposition (PVD), etc.

In some embodiments, the first dielectric layer 104 can be formed of a high constant dielectric and/or a stack of layers including at least one barrier layer and at least one high constant dielectric layer. If a high constant dielectric layer is used, in some embodiments a barrier layer is formed between the high constant dielectric layer and the substrate 102.

In one embodiment, the thickness of the first dielectric layer 104 can depend upon the material selected and/or programming voltages to be used with the resulting memory cell 100. For example, in some embodiments, the first dielectric layer 104 formed of silicon dioxide can have a thickness of less than ten (10) nanometers (nm). In some embodiments, the first dielectric layer 104 can have a thickness of at least two (2) nm. In other embodiments, the first dielectric layer 104 can have a thickness in the range from two (2) nm to four (4) nm.

As discussed herein, the nanodots 106 of the present disclosure are used to form the floating gate of a memory cell device 100. In some embodiments, the nanodots 106 can have a size in the range of two (2) to five (5) nm in diameter. In addition, the nanodots can be provided over the first dielectric layer 104 by chemical vapor deposition (CVD). Alternatively, in one embodiment, the nanodots 106 can also be deposited via atomic layer deposition (ALD) and/or physical vapor deposition (PVD).

To prevent the destabilization of the memory structure, the nanodots 106 are formed of materials that are essentially non-reactive. In some embodiments, the nanodots 106 can be formed of a metal. In such embodiments, the nanodots 106 can be formed of a metal selected from a group consisting of platinum, ruthenium, rhodium, iridium, chromium, titanium, molybdenum, tungsten, and/or osmium. In various embodiments the nanodots 106 can be formed of a material that has a melting point of at least one thousand six hundred (1600) degrees Celsius (° C.). In some embodiments, the nanodots 106 can be formed of a semiconductor. The use of other materials for the nanodots 106 is also possible.

In one example embodiment, nanodots 106 made of platinum can be deposited using a chemical vapor deposition process where, for example, (trimethyl)-methylcyclopentadienyl platinum (IV) is reacted with oxidizing gases such as $O_2$ and $N_2O$ at about 380-420° C. to deposit platinum on the first dielectric layer 104 which self-forms as nanodots 106 on the tunnel oxide layer 104. Further, the substrate 102 can be annealed at a temperature of from about two hundred (200) ° C. to about eight hundred (800) ° C., in the presence of nitrogen ($N_2$) or oxygen ($O_2$) in a vacuum atmosphere to convert the platinum to platinum nanodots. Furthermore, the nanodots 106 may be composed of materials such as Rhodium (Rh) and Ruthenium (Ru), which upon oxidation stay conductive, utilizing the processing steps described herein.

As shown in the example embodiment of FIG. 1A, an intergate dielectric layer 110 can be deposited on the first dielectric layer 104. In some embodiments, the intergate dielectric layer 110 can be a silicon dioxide layer. In some embodiments, the intergate dielectric layer 110 can be a silicon nitride layer. In addition, in such embodiments the intergate dielectric layer 110 can be deposited by LPCVD. Also, in one embodiment, a control gate layer 111 can be deposited on the intergate dielectric layer 110. The control gate layer 111 can be formed of tantalum nitride (TaN), titanium nitride (TiN), or poly-silicon ($p^+$), among other materials.

FIG. 1B illustrates a structure embodiment of the memory cell 100 after a next sequence of processing step. For example, FIG. 1B illustrates the memory cell 100 structure after the intergate dielectric layer 110 and control gate layer 111 has been patterned and etched to form a portion of a memory cell stack 112. In one embodiment, the control gate layer 111 and a portion of the intergate dielectric layer 110 are masked and patterned into a gate stack 112, forming a sidewall 114. Suitable techniques for removing (e.g., etching) the layers to form the gate stack 112 can include etching techniques such as, but not limited to: reactive ion etching (RIE), plasma etching, and ion beam etching. In one embodiment, the gate stack 112 is formed by a dry etch. Suitable gases that can be employed in the dry etching process include: $CHF_3$, $CF_4$, $CHF_4$, $SF_6$, or $NF_3$, and combinations thereof. The gases may also be used in conjunction with oxygen or an inert gas such as nitrogen or helium. Other dry etch techniques are also possible to etch the gate stack 112 and form the sidewall 114.

In one embodiment, the dry etch removes a portion of the intergate dielectric layer 110 and exposes the nanodots 106. In addition, in some embodiments, a sidewall 114 is formed having a planar surface 116 approximately perpendicular to the etched surface 118 of the intergate dielectric layer 110. In such embodiments, the planar surface 116 of the sidewall 114 can contain a location where a nanodot 106 has been deposited 119, shown as such in FIG. 1B.

FIG. 1C illustrates an embodiment of the memory cell stack 112 after the next sequence of processing steps. According to various embodiments, using an intergate dielectric layer 110 with a thickness of ten (10) nm or less, an anisotropic etch may be used until the first dielectric layer 104 is reached. Then a selective etch can be used to more gracefully continue to etch so as not to etch through first dielectric layer 104.

In some embodiments, the remaining portion of the intergate dielectric layer 110 and the nanodots 106 are etched. In such embodiments, the etch is selective to the intergate dielectric layer 110. In other words, the etch rate for the nanodots 106 is higher compared to the etch rate for the intergate dielectric layer 110. In some embodiments, the etch can be an isotropic etch. In various embodiments, the selective etch can be a semi-isotropic etch. In one embodiment, the isotropic etch is a wet etch. In an additional embodiment, the isotropic etch is a dry etch. However, since the etch is more aggressive towards the nanodots 106 as compared to the intergate dielectric layer 110, in some embodiments the sidewall 114 may have at least a portion of a hollow at a location where a nanodot 106 was previously deposited, but has been removed as a result of the selective etch. As used herein, a hollow can include a cavity, a gap, and/or a space in the intergate dielectric layer 110 where a nanodot 106 had previously resided. The hollow can form a void 119 in the intergate dielectric layer 110, where the presence of this void 119 can lead to and/or cause charge retention problems for the memory cell 100.

As discussed herein, in a memory cell with a conventional monolithic floating gate defects in the first dielectric layer (e.g., 104) can cause charge retention problems when the floating gate is in the form of a solid layer rather than a nanodot layer. Similarly, the presence of the void 119, or portion of a void 119, between a control gate and a channel region or source and drain regions of the non-volatile memory cell may cause data retention problems in the electron storage device. To prevent the loss of data retention, a spacing layer 120 is used to plug and/or fill the void 119, as discussed herein. By filling the void 119 with a spacing layer 120, when a voltage is applied to the floating gate (i.e. the nanodots 106) to shift the threshold voltage of the device, the current is less likely to be disrupted by a void, or empty space 119, in the intergate dielectric layer 110. Therefore the excited electrons are more likely to be pushed through and trapped on the other side of the intergate dielectric layer 110, creating a barrier between the control gate or source and drain regions and the floating gate formed by the nanodots 106, causing the memory cell to potentially shift in its detectable charged or uncharged state, e.g., from a value of one (1) to a value of zero (0).

Referring now to FIG. 1D, the memory cell 100 is shown including a spacing layer 120. In one embodiment, the spacing layer 120 can be blanket deposited over the gate stack 112 to cover the first dielectric layer 104, the sidewall 114, and the at least a portion of a void 119 previously occupied by a portion of a nanodot formed in the sidewall surface 116.

The spacing layer 120 can be formed of various materials. In some embodiments, the spacing layer 120 is formed of a compound having etch stopping capabilities, for example, $Si_3N_4$. In various embodiments, the spacing layer 120 can be formed of $SiO_2$. In some embodiments, the spacing layer 120 can be formed of the same material as the intergate dielectric layer 110. In such embodiments, the spacing layer 120 can be formed of tantalum pent-oxide ($Ta_2O_5$), $BaSrTiO_3$, hafnium oxide ($HfO_2$), or zirconium dioxide ($ZrO_2$), as discussed herein.

In some embodiments, the spacing layer 120 can be deposited using a high conformality deposition step, for example atomic layer deposition (ALD). In such embodiments, the spacing layer 120 can be deposited without thermal treatment. In some embodiments, the spacing layer 120 can be deposited with thermal treatment at a temperature of up to nine hundred (900) degrees Celsius. The spacing layer 120 can also be deposited using a similar high conformality deposition step, for example, LPCVD and PECVD.

In some embodiments, the spacing layer 120 can have a thickness equal to at least the diameter of the nanodots 106. For example, as discussed herein, the nanodots can have a diameter in the range of two (2) to five (5) nm. It follows that in some embodiments, the spacing layer 120 can have a thickness in the range of two (2) to five (5) nm. In various embodiments, the spacing layer 120 can have a thickness (T) that is a function of the diameter (d) of the nanodots 106. In such embodiments, the function can be range from T=d to T=1.5d.

Referring now to FIG. 1E, the spacing layer 120 can be etched back to form sidewall spacers 121. As used herein, sidewall spacers 121 refer to the portion of the spacing layer 120 that remains after the spacing layer 120 is etched back. In one embodiment, the sidewall spacers 121 cover the sidewall surface 116 and the portion of the void 119 previously occupied by at least a portion of a nanodot 106. As discussed herein, the spacing layer 120 can be formed of nitride compounds which can have etch stopping capabilities. As shown in FIG. 1E, the first dielectric layer 104 can be etched while using the spacing layer 120 as a mask. In addition, source/drain regions 122, 124 can be formed by a suitable process, as processes for such implantation are used in the relevant industry. For example, in one embodiment, the source/drain regions 122, 124 are formed by ion-implantation of dopants into the substrate.

Figure 2A:
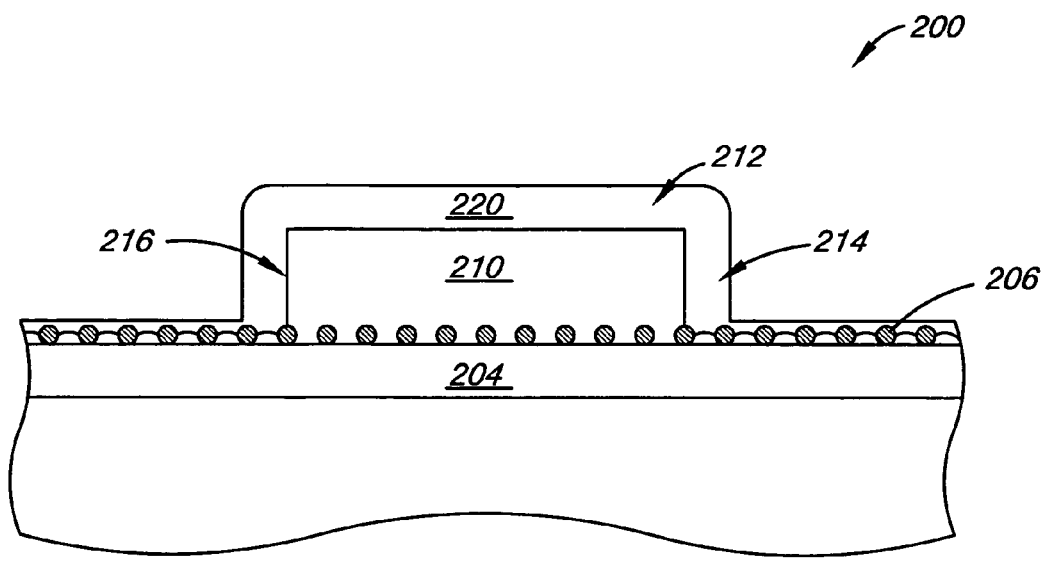
FIGS. 2A-2B illustrate cross-sectional views of a portion of a memory array during various stages of fabrication in accordance with an embodiment of the present disclosure.

FIG. 2A illustrates another sequence of processing steps continuing from the structure shown in FIG. 1B, as discussed herein. As illustrated in FIG. 2A, in some embodiments, the spacing layer 220 can be deposited over the gate stack 212 between the dry etch and the etch that is selective to the intergate dielectric layer 210. In such embodiments, the spacing layer 220 would be blanket deposited over the gate stack 212 to cover the first dielectric layer 204, the sidewall 214, and the location where a nanodot 206 has been deposited in the sidewall surface 216, as discussed herein.

However, since the spacing layer 220 can be deposited before the etch selective to the intergate dielectric layer 210, the sidewall 214 which includes a location where a nanodot 206 has been deposited may also contain a nanodot 206. In such embodiments, therefore, the spacing layer 220 can have a thickness at least equal to about the diameter of the nanodots 206. In this way, the spacing layer 220 can be thick enough to cover a nanodot 206 encased in the intergate dielectric layer 210 in the sidewall 214 of the gate stack 212. In such embodiments, once the spacing layer 220 is deposited, the etch selective to the intergate dielectric layer 210 can be performed as discussed herein to form the memory cell 200 shown in FIG.

2B. In the embodiments described with respect to FIGS. 2A-2B, the missing dot cannot occur since the spacing layer is deposited before the etch to remove a portion of the nanodots 206 occurs.

Figure 3A:
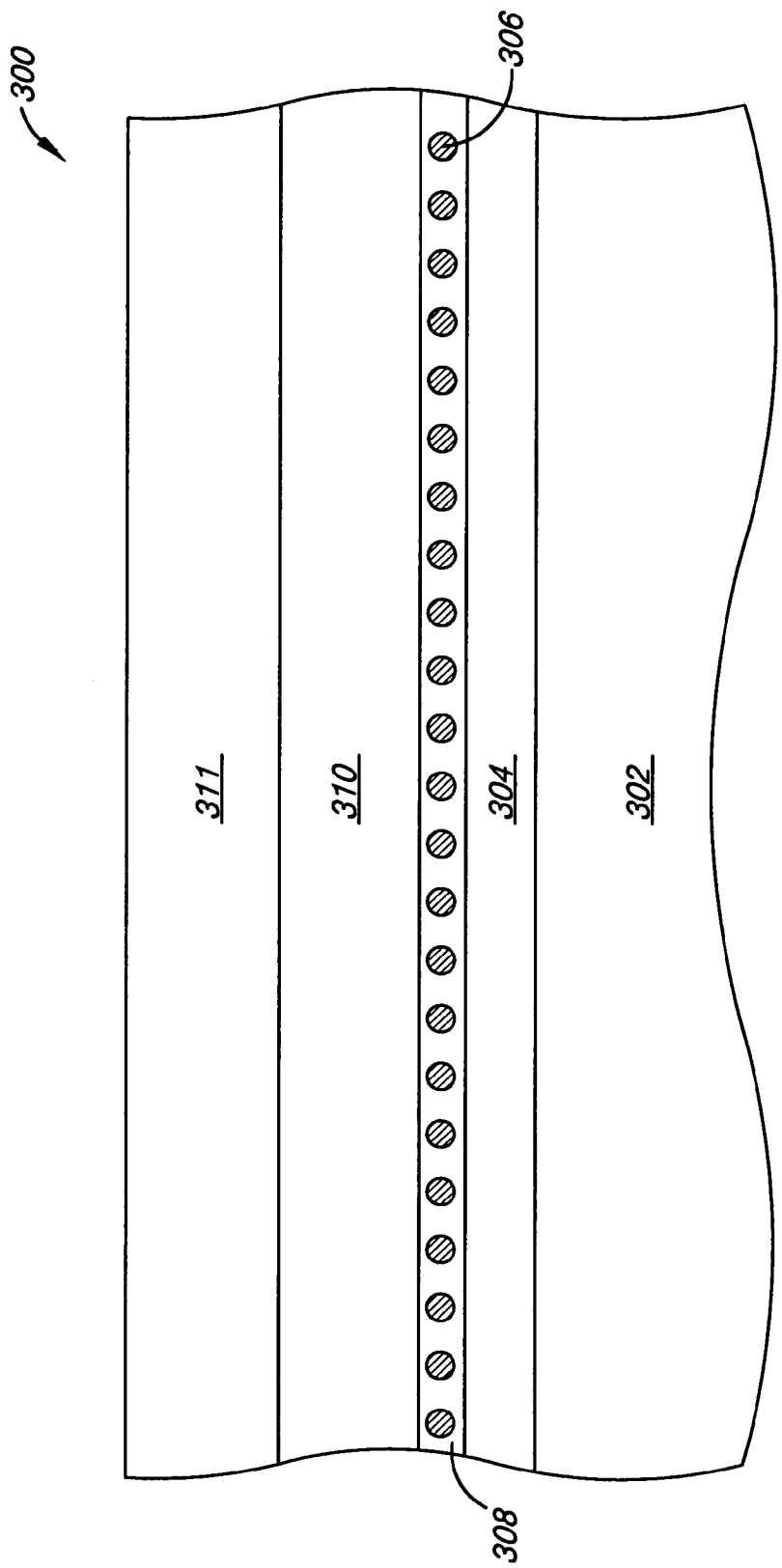
Figure 3B:
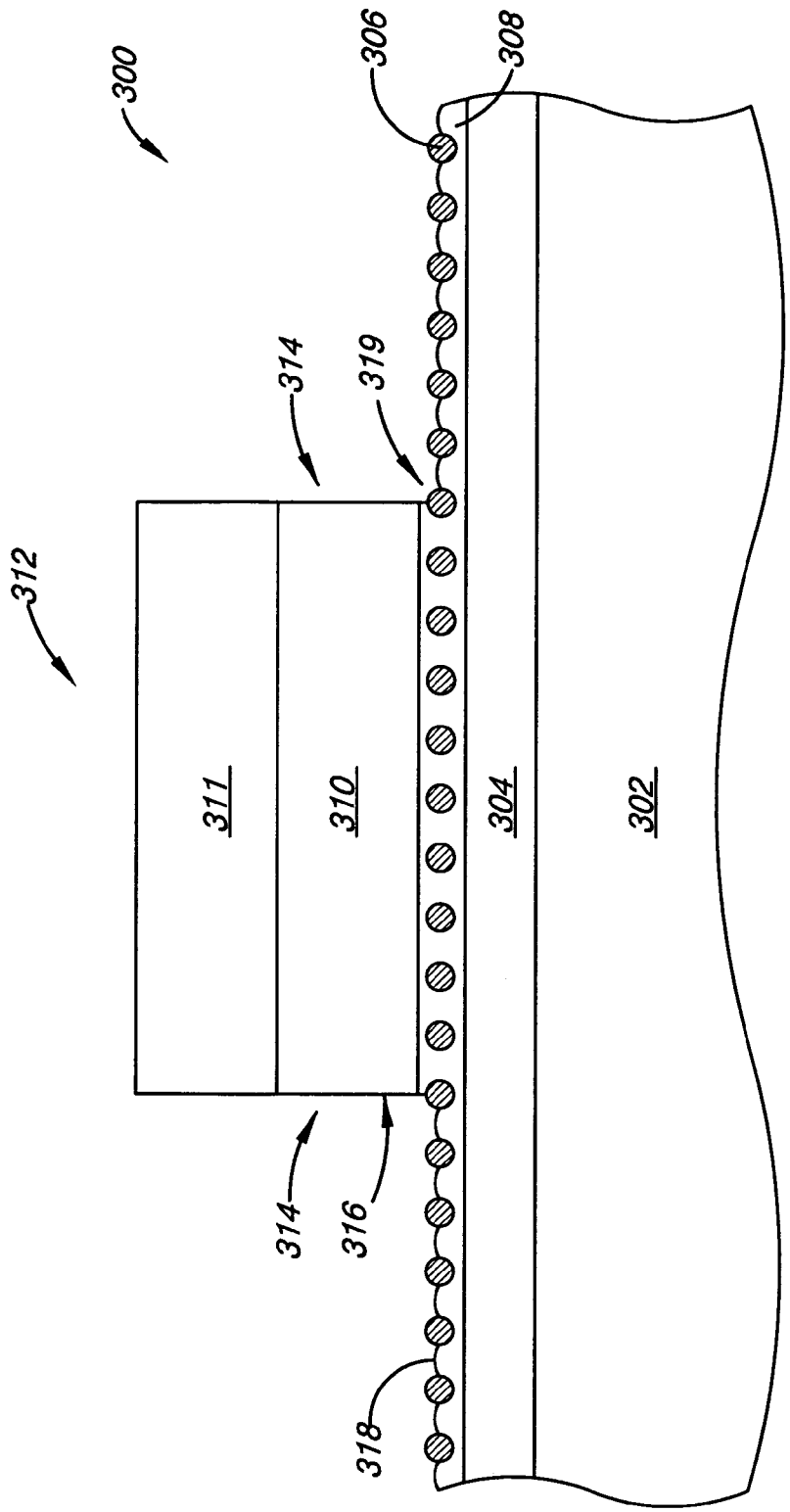
Figure 3C:
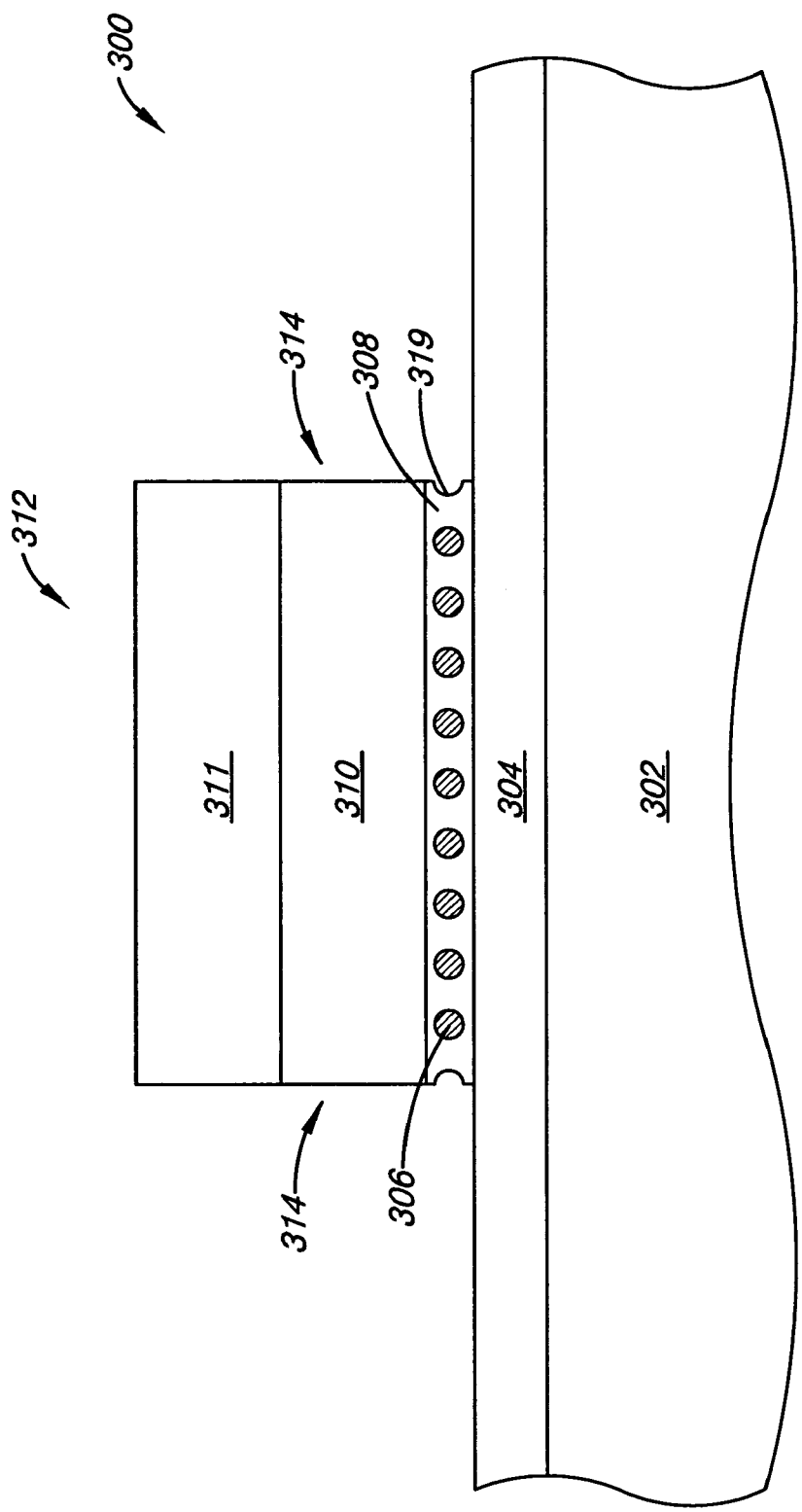
Figure 3E:
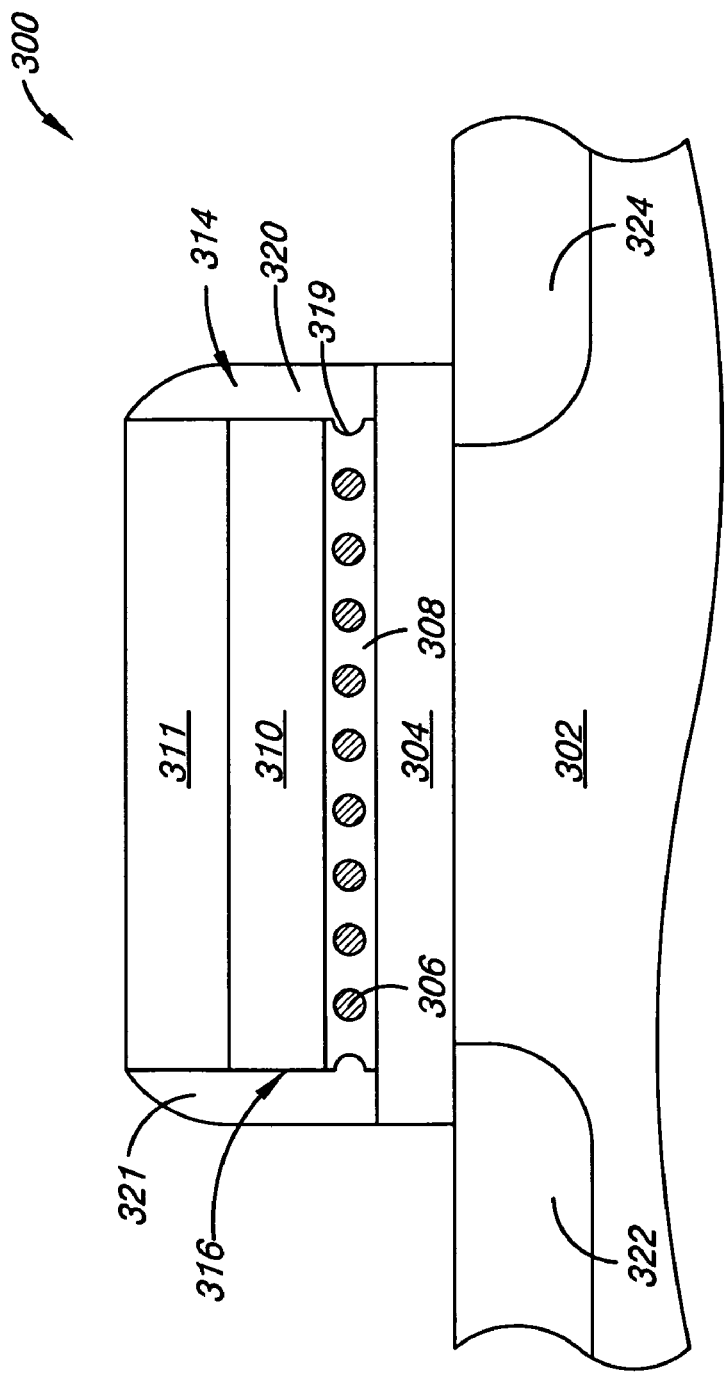

FIGS. 3A through 3E illustrate an example of an embodiment of a method of fabricating a memory cell including a nanodot layer, a second dielectric layer, a spacer, and the resulting device (FIG. 3E). Similar process steps, as described with respect to FIGS. 1A through 1E, can be applied to obtain the memory cell 300 as illustrated in FIGS. 3A through 3E.

In some embodiments, a second dielectric layer 308 can be formed over the nanodots 306. In some embodiments, the second dielectric layer 308 can be formed over the nanodots 306 by CVD. Since the nanodots 306 can be formed to be separate and isolated, the second dielectric layer 308 can be formed interstitially between the nanodots 306, encasing the nanodots 306 in the second dielectric layer 308.

In some embodiments, the second dielectric layer 308 can be made from an advanced dielectric, for example, tantalum pent-oxide ($Ta_2O_5$), $BaSrTiO_3$, hafnium oxide ($HfO_2$), or zirconium dioxide ($ZrO_2$), which have very high dielectric constants (about twenty-five (25) or greater) when deposited. As used herein, an advanced dielectric is a dielectric which allows device scaling below 0.1 μm. Advanced dielectric materials are useful for maintaining and/or increasing the amount of energy at a given voltage that each device can store, thereby reducing operating voltages.

In some embodiments, the first dielectric and second dielectric layer 304, 308, comprise a composite layer. Although not shown, in such embodiments, a barrier layer of silicon dioxide layer can be formed over the second dielectric layer 308 when the second dielectric layer 308 comprises an advanced dielectric.

As shown in the example embodiment of FIG. 3A, an intergate dielectric layer 310, as discussed herein, can be deposited on the second dielectric layer 108. Also, in one embodiment, a control gate layer 311, as discussed herein, can be deposited on the intergate dielectric layer 310.

FIG. 3B illustrates a structure embodiment of the memory cell 300 after a next sequence of processing steps. For example, FIG. 3B illustrates the memory cell 300 structure after the intergate dielectric layer 310 and control gate layer 311 has been patterned and etched to form a portion of a memory cell stack 312. In one embodiment, the control gate layer 311, the intergate dielectric layer 310, and a portion of the second dielectric layer 308 are masked and patterned into a gate stack 312, forming a sidewall 314. Suitable techniques for removing (e.g., etching) the layers to form the gate stack 312 can be as discussed herein with reference to FIG. 1B.

In one embodiment, a dry etch can remove the intergate dielectric layer 310 and a portion of the second dielectric layer 308 and expose the nanodots 306. In addition, in some embodiments, a sidewall 314 is formed having a planar surface 116 approximately perpendicular to the etched surface 318 of the second dielectric layer 308. In such embodiments, the planar surface 316 of the sidewall 314 can contain a location where a nanodot 306 has been deposited 319, shown as such in FIG. 3B.

FIG. 3C illustrates an embodiment of the memory cell stack 312 after the next sequence of processing steps. According to various embodiments, using a second dielectric layer 308 with a thickness of ten (10) nm or less, an anisotropic etch may be used until the first dielectric layer 304 is reached. Then an etch selective to the second dielectric layer 308 can be used to more gracefully continue to etch so as not to etch through first dielectric layer 304.

In some embodiments, the remaining portion of the second dielectric layer 308 and the nanodots 306 are etched. In some embodiments, the etch is selective to the second dielectric layer 308 and is an isotropic etch. In some embodiments, the etch selective to the second dielectric layer is a semi-isotropic etch. In such embodiments, the etch can be selective to the second dielectric layer 308. In other words, the etch rate for the nanodots 306 is higher compared to the etch rate for the second dielectric layer 308. In one embodiment, the etch is a wet etch. In an additional embodiment, the etch is a dry etch. However, since the etch is more aggressive towards the nanodots 306 as compared to the second dielectric layer 308, in some embodiments the sidewall 314 may have at least a portion of a hollow at a location where a nanodot 306 was previously deposited, but has been removed as a result of the selective isotropic etch. The hollow can form a void 319 in the second dielectric layer 308, where the presence of this void 319 can lead to and/or cause charge retention problems for the memory cell 300.

Referring now to FIG. 3D, the memory cell 300 is shown including a spacing layer 320, as discussed herein. In one embodiment, the spacing layer 320 can be blanket deposited over the gate stack 312 to cover the first dielectric layer 304, the sidewall 314, and the at least a portion of a void 319 previously occupied by a portion of a nanodot formed in the sidewall surface 316.

As discussed herein, the spacing layer 320 can be formed of various materials. In some embodiments, the spacing layer 320 can be formed of the same material as the second dielectric layer 308. In such embodiments, the spacing layer 320 can be formed of tantalum pent-oxide ($Ta_2O_5$), $BaSrTiO_3$, hafnium oxide ($HfO_2$), or zirconium dioxide ($ZrO_2$), as discussed herein.

Referring now to FIG. 3E, the spacing layer 320 can be etched back to form sidewall spacers 321, as discussed herein. In addition, source/drain regions 322, 324 can be formed by a suitable process, as discussed herein.

Figure 4:
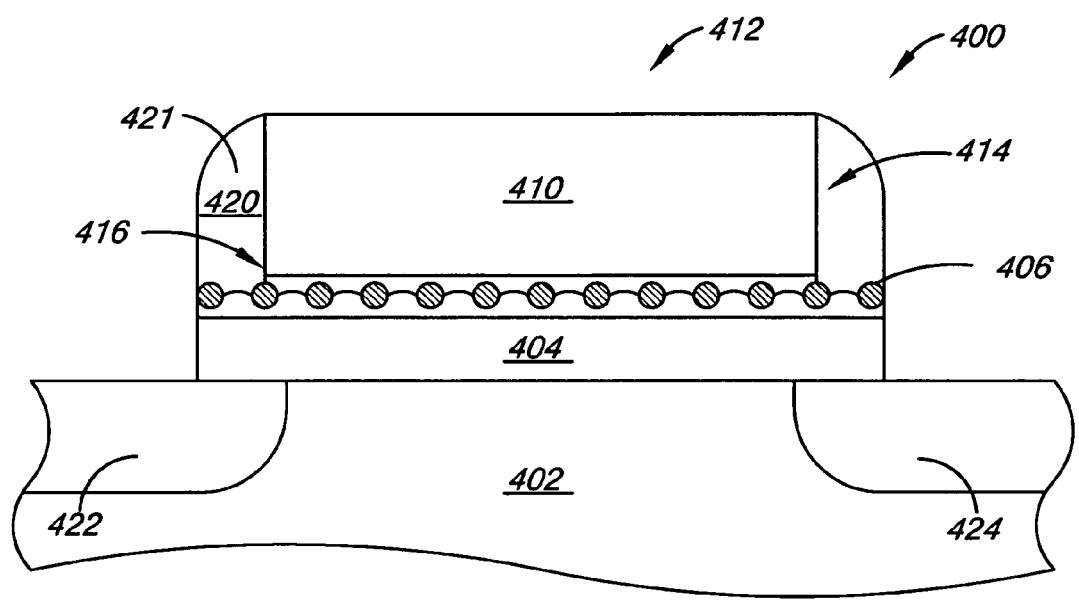
FIG. 4 illustrates a cross-sectional view of a portion of a memory array during a stage of fabrication in accordance with an embodiment of the present disclosure.

FIG. 4 illustrates the memory cell 400 when the spacing layer 420 is deposited over the gate stack 412 between the dry etch and the etch selective to the second dielectric layer 408, as discussed herein with respect to FIGS. 2A through 2E. The embodiment illustrated in FIG. 4 is produced by starting from the structure shown in FIG. 3B and using the method of deposing the spacing layer 420 over the gate stack 412 between the dry etch and the etch selective to the second dielectric layer 408, as discussed herein.

The memory cell device 100, 200, 300, 400 can be efficiently fabricated and can use the nanodots 106, 206, 306, 406 as the electron trapping layer. Accordingly, the semiconductor device of the embodiment is suitable as a non-volatile memory and can be scaled for future technologies. The device 100, 200, 300, 400 can be used as an electron storage device which stores one electron per nanodot, or as a device which stores more than one electron per nanodot. Furthermore, a device according to the present disclosure can be more reliable in that if one of the nanodots fails, the other nanodots will not be affected.

Figure 5:
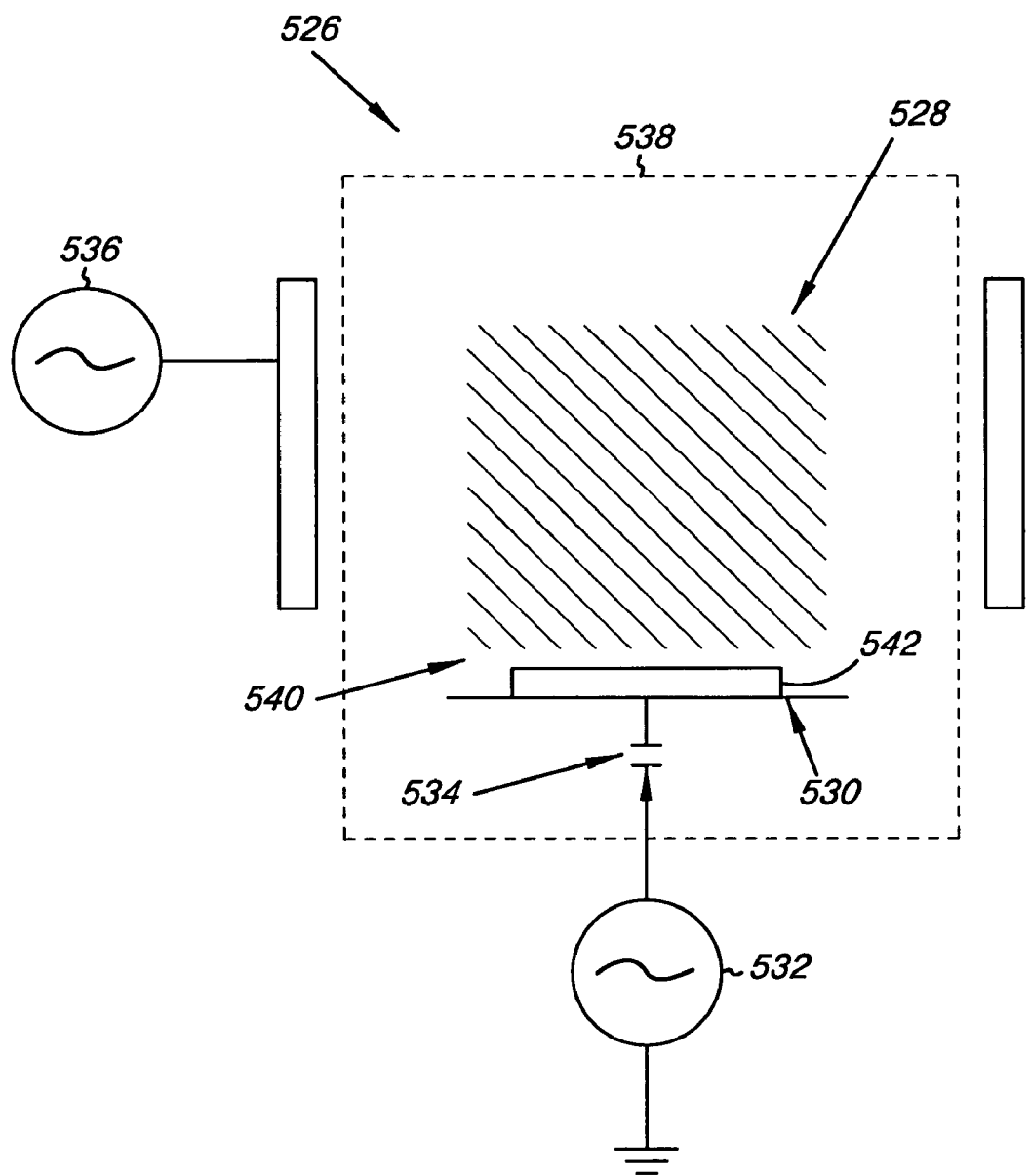
FIG. 5 illustrates a general diagram of a plasma generation device in which embodiments of the present disclosure may be used.

FIG. 5 shows an illustrative etch reactor 526 for performing etching. It should be recognized that this is an illustrative diagram representative of an entire system even though only several components of the system are shown. Various systems incorporating many elements in various configurations may be utilized. To generate plasma 528, a gas is provided to the etch reactor 526. In one embodiment, a first gaseous etchant is provided to the etch reactor 526 to perform a dry etch to form a sidewall of the gate stack, as discussed herein. In addition, in one embodiment a second gaseous etchant is provided to the etch reactor 526 to perform a wet or dry etch to etch the spacing layer. In addition, in one embodiment, the gas provided to the plasma generation apparatus 526 is changed to supply a third gaseous etchant, where the third gaseous etchant forms a plasma 528 that is selective to the intergate dielectric layer and the spacing layer, or the second dielectric layer and the spacing layer, to etch the nanodots more aggressively than the intergate dielectric layer or the second dielectric layer, respectively. As discussed herein, the spacing layer can also be etched after the etch is performed with the third gaseous etchant.

The illustrative etch reactor 526 includes a powered electrode 530 connected to an RF bias source 532 via capacitance 534 upon which a semiconductor substrate having an insulating layer to be etched is placed. Further, a power source 536 is connected to elements, e.g., coils, for generating the plasma 528 in chamber 538. Ion sheath 540 is formed between the plasma 528 and the powered electrode 530. With the semiconductor substrate 542 positioned within the etch reactor 526, the insulating layer is etched in accordance with the embodiments resulting in the structure of FIGS. 1E, 2B, 3F, and 4. The power source 536 utilized may be a suitable power source including an RF generator, a microwave generator, etc. It will be readily apparent that other etch reactor systems may also be used.

Figure 2B:
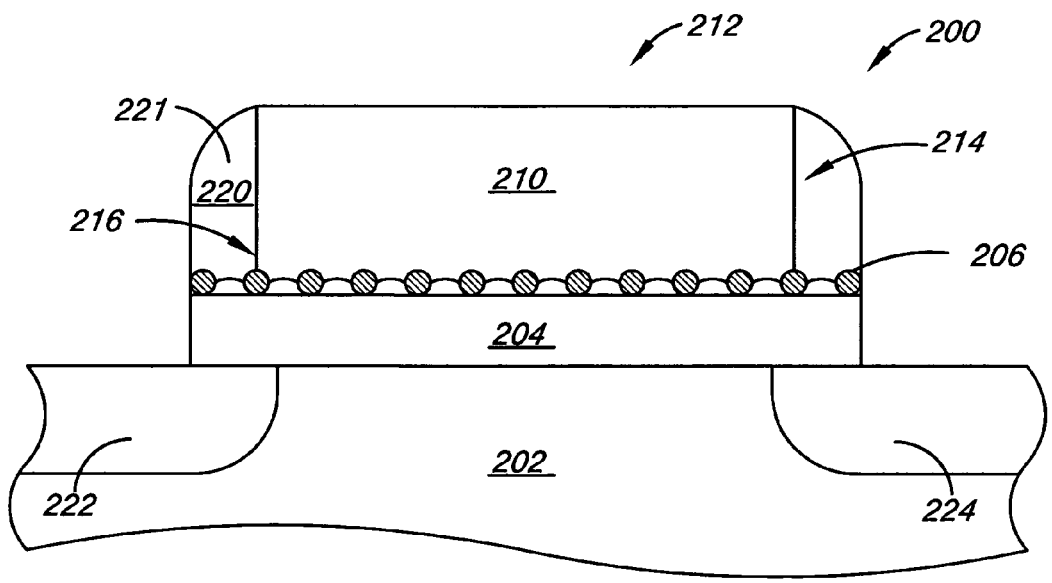
Figure 6:
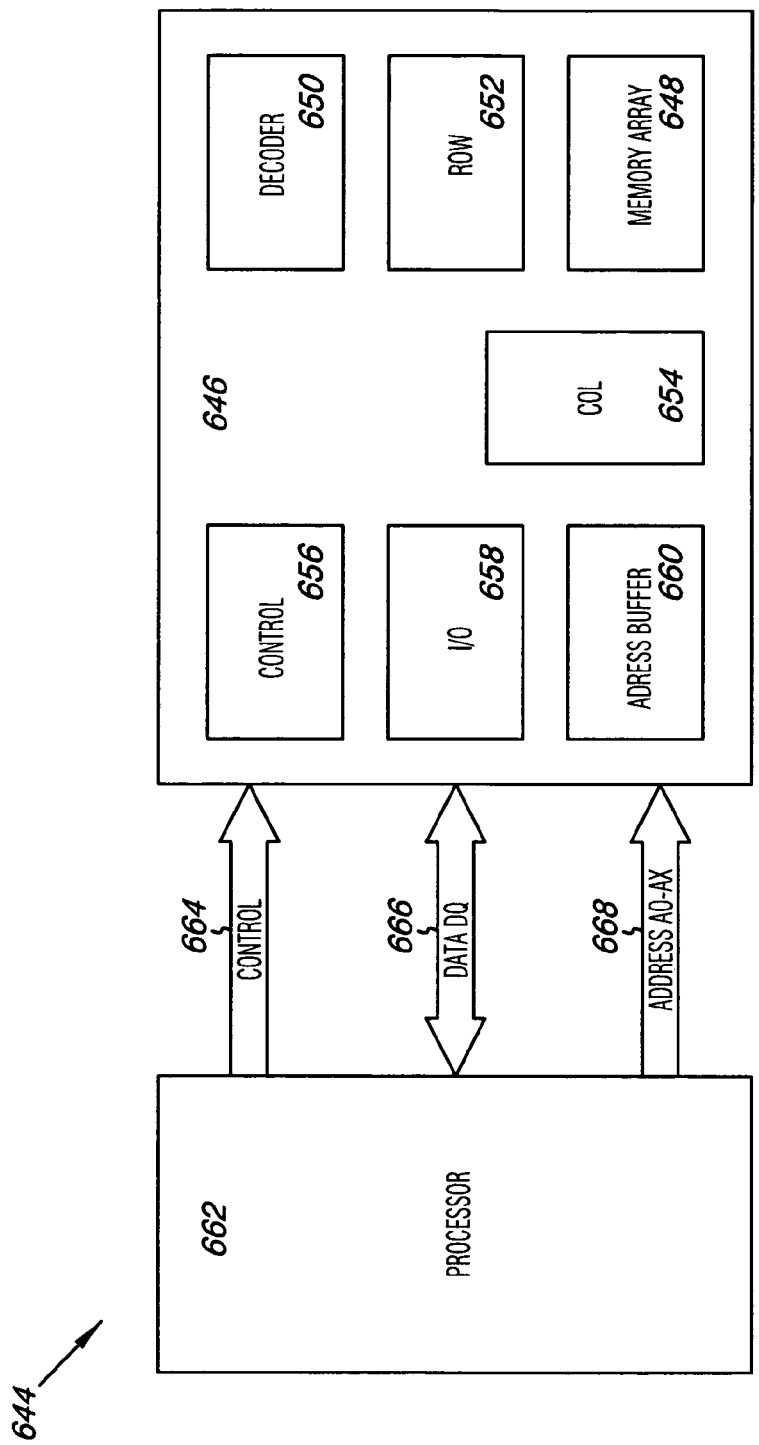
FIG. 6 illustrates a functional block diagram of an electronic system having at least one memory device in accordance with an embodiment of the present disclosure.

FIG. 6 illustrates an example of an embodiment of an electronic system 644 which utilizes a non-volatile memory device 646 containing the memory cell 100 of FIG. 1D, the memory cell 200 of FIG. 2B, the memory cell 300 of FIG. 3D, or the memory cell 400 of FIG. 4. Electronic system 644 includes a non-volatile memory device 646 that includes an array of non-volatile memory cells 648, an address decoder 650, row access circuitry 652, column access circuitry 654, control circuitry 656, Input/Output (I/O) circuitry 658, and an address buffer 660.

The array 648 of non-volatile memory cells has a NAND architecture in accordance with an embodiment of the disclosure. The memory cells (not shown in FIG. 6) of the array 648 of non-volatile memory cells may be floating-gate memory cells, NROM cells or other type of one-transistor non-volatile memory cells.

Electronic system 644 includes an external processor 662, e.g., a memory controller or host processor, electrically connected to memory device 646 for memory accessing. The memory device 646 receives control signals from the processor 662 over a control link 664. The memory cells are used to store data that are accessed via a data (DQ) link 666. Address signals are received via an address link 668 that are decoded at address decoder 650 to access the memory array 648. Address buffer circuit 660 latches the address signals. The memory cells are accessed in response to the control signals and the address signals.

The control link 664, data link 666 and address link 668 can be collectively referred to as access lines. It will be appreciated by those skilled in the art that additional circuitry and control signals can be provided, and that the memory device detail of FIG. 6 has been reduced to facilitate ease of illustration. As stated herein, the basic flash memory device 646 has been simplified to facilitate a basic understanding of the features of the memory device. A more detailed understanding of flash memories is known to those skilled in the art. As is well known, such basic flash memory device 646 may be fabricated as integrated circuits on a semiconductor substrate. The memory cells described above are used in various embodiments in the basic memory array or system structure described in FIG. 6.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

CONCLUSION

Memory cell structures and methods of fabrication have been described that include forming floating gates in the form of nanodots to accommodate the diminishing feature size of elements on a chip.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of fabricating a memory cell, comprising:
    depositing nanodots over a first dielectric material;
    forming an intergate dielectric material over the nanodots, where the intergate dielectric material encases the nanodots;
    removing a portion of the intergate dielectric material to form sidewalls of the memory cell, wherein at least one of the sidewalls includes at least a portion of a hollow therein where a nanodot had been deposited and subsequently removed; and
    filling the void where the nanodot had been deposited and subsequently removed by forming a spacing material over the sidewalls, the spacing material being different from the intergate dielectric material.

2. The method of claim 1, including forming the at least a portion of the hollow by removing a remaining portion of the intergate dielectric material and nanodots therein using an etch selective to the intergate dielectric material, and where the etch selective to the intergate dielectric material is an isotropic etch.

3. The method of claim 1, including forming the at least a portion of the hollow by removing a remaining portion of the intergate dielectric material and nanodots therein using an etch selective to the intergate dielectric material, and where the etch selective to the intergate dielectric material is a semi-isotropic etch.

4. The method of claim 1, where the spacing material is formed over the sidewalls after a dry etch is performed to form sidewalls of the memory cells.

5. The method of claim 1, including forming the at least a portion of the hollow by removing a remaining portion of the intergate dielectric material and nanodots therein using an etch selective to the intergate dielectric material, and where the spacing material is formed over the sidewalls after the etch selective to the intergate dielectric is performed.

6. A method of fabricating a memory cell, comprising:
depositing nanodots over a first dielectric material;
forming an intergate dielectric material over the nanodots, where the intergate dielectric material encases the nanodots;
removing a portion of the intergate dielectric material to form sidewalls of the memory cell, wherein the sidewalls include at least a portion of a nanodot;
removing a remaining portion of the intergate dielectric material and the nanodots with an etch selective to the intergate dielectric material, creating at least a portion of a hollow previously occupied by the portion of a nanodot in the sidewalls; and
forming spacers over the sidewalls of the memory cell to fill the portion of the hollow, the spacers being of a different material than the intergate dielectric material.

7. The method of claim 6, wherein the etch selective to the intergate dielectric material is a wet etch.

8. The method of claim 6, wherein forming spacers includes forming spacers that have a thickness equal to at least a diameter of a nanodot.

9. The method of claim 6, wherein forming nanodots includes forming nanodots to have a diameter in a range of two (2) to five (5) nanometers (nm).

10. A method of fabricating a memory cell, comprising:
supplying a first gaseous etchant to a etch reactor;
supplying a patterned masking material over a first dielectric material and an intergate dielectric material;
dry etching with a plasma of the first gaseous etchant the intergate dielectric material and the first dielectric material;
forming sidewalls in the first dielectric material and the intergate dielectric material wherein the sidewalls include a location where a nanodot has been deposited;
etching with a plasma of a second gaseous etchant the intergate dielectric material and the nanodots, where the plasma of the second gaseous etchant is selective to the intergate dielectric material;
forming a spacing material over the sidewall and the patterned masking material to fill a void at the location where a nanodot had been deposited and subsequently removed; and
dry etching with a plasma of a third gaseous etchant the spacing material from the patterned masking material.

11. The method of claim 10, where the first gaseous etchant and the third gaseous etchant have similar chemical compositions.

12. The method of claim 10, where forming the spacing material over the sidewall and the patterned masking material occurs after dry etching with a plasma of the first gaseous etchant.

13. The method of claim 10, where forming the spacing material over the sidewall and the patterned masking material occurs after etching with a plasma of the second gaseous etchant.

14. The method of claim 10, further including forming a control gate material separated from the nanodots by the intergate dielectric material.

* * * * *